United States Patent
Oie et al.

(10) Patent No.: US 10,538,718 B2
(45) Date of Patent: Jan. 21, 2020

(54) CLEANING SOLUTION AND CLEANING METHOD FOR MATERIAL COMPRISING CARBON-INCORPORATED SILICON OXIDE FOR USE IN RECYCLING WAFER

(71) Applicant: MITSUBISHI GAS CHEMICAL COMPANY, INC., Chiyoda-ku (JP)

(72) Inventors: Toshiyuki Oie, Tokyo (JP); Kenji Shimada, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 101 days.

(21) Appl. No.: 15/564,918

(22) PCT Filed: Apr. 8, 2016

(86) PCT No.: PCT/JP2016/061467
§ 371 (c)(1),
(2) Date: Oct. 6, 2017

(87) PCT Pub. No.: WO2016/167184
PCT Pub. Date: Oct. 20, 2016

(65) Prior Publication Data
US 2018/0087006 A1 Mar. 29, 2018

(30) Foreign Application Priority Data
Apr. 13, 2015 (JP) ................. 2015-081443

(51) Int. Cl.
| C11D 7/32 | (2006.01) |
| C11D 1/40 | (2006.01) |
| C11D 1/62 | (2006.01) |
| H01L 21/304 | (2006.01) |
| C11D 3/04 | (2006.01) |
| C11D 11/00 | (2006.01) |
| H01L 21/311 | (2006.01) |

(52) U.S. Cl.
CPC ................. *C11D 1/40* (2013.01); *C11D 1/62* (2013.01); *C11D 3/042* (2013.01); *C11D 11/0047* (2013.01); *H01L 21/304* (2013.01); *H01L 21/31111* (2013.01)

(58) Field of Classification Search
CPC .................................................. C11D 11/0047
USPC .................................................. 510/175, 176
See application file for complete search history.

(56) References Cited

U.S. PATENT DOCUMENTS

| 2003/0148910 A1* | 8/2003 | Peters ................. C11D 3/0073 510/405 |
| 2004/0108299 A1 | 6/2004 | Kikuyama et al. |
| 2006/0138399 A1 | 6/2006 | Itano et al. |
| 2008/0125342 A1 | 5/2008 | Visintin et al. |
| 2008/0261847 A1* | 10/2008 | Visintin ............ H01L 21/02079 510/176 |
| 2009/0233447 A1 | 9/2009 | Liang et al. |
| 2010/0173431 A1 | 7/2010 | Okita et al. |
| 2010/0227432 A1 | 9/2010 | Kashkoush |
| 2011/0223767 A1 | 9/2011 | Liang et al. |
| 2011/0275164 A1 | 10/2011 | Visintin et al. |
| 2015/0194563 A1 | 7/2015 | Kashkoush |
| 2015/0315712 A1* | 11/2015 | Hawes .................. C11D 3/046 510/257 |
| 2016/0185595 A1* | 6/2016 | Chen ................. H01L 21/02063 216/13 |

FOREIGN PATENT DOCUMENTS

| JP | 10-177998 A | 6/1998 |
| JP | 2006-203181 A | 8/2006 |
| JP | 2010-509777 A | 3/2010 |
| JP | 2014-29942 A | 2/2014 |
| WO | 2004/019134 A1 | 3/2004 |
| WO | 2009/031270 A1 | 3/2009 |
| WO | 2010/102013 A2 | 9/2010 |
| WO | WO 2015/017659 A1 | 2/2015 |

OTHER PUBLICATIONS

Extended European Search Report dated Sep. 27, 2018 in Patent Application No. 16779975.8, citing documents AA-AC & AO-AP therein, 8 pages.
International Search Report dated Jun. 21, 2016 in PCT/JP2016/061467 filed Apr. 8, 2016.
"Amphoteric surfactants" retrieved from https://www.chemicalbook.com/ProductCatalog_EN/1813.htm, Keywords: 18162-48-6 , 872-50-4 , Methylene Chloride , naphthalene , THF , Titanium Dioxide.

* cited by examiner

*Primary Examiner* — Gregory E Webb
(74) *Attorney, Agent, or Firm* — Oblon, McClelland, Maier & Neustadt, L.L.P.

(57) ABSTRACT

It is an object of the present invention to provide a cleaning solution for removing carbon-incorporated silicon oxide (SiOC) from the surface of a wafer in a step of producing a wafer having a material comprising the SiOC, and a cleaning method of using the same. The cleaning solution of the present invention comprises 2% by mass to 30% by mass of a fluorine compound, 0.0001% by mass to 20% by mass of a specific cationic surfactant that is an ammonium salt or an amine, and water, and has a pH value of 0 to 4.

6 Claims, No Drawings

CLEANING SOLUTION AND CLEANING METHOD FOR MATERIAL COMPRISING CARBON-INCORPORATED SILICON OXIDE FOR USE IN RECYCLING WAFER

TECHNICAL FIELD

The present invention relates to a cleaning solution for etching carbon-incorporated silicon oxide (hereinafter referred to as "SiOC") on the surface of a wafer in a step of producing a wafer having a material comprising the SiOC, and a cleaning method of using the same.

BACKGROUND ART

In recent years, miniaturization of design rule has progressed, and signal transmission delay has governed the limit of high-speed processing. Thus, the conductive wiring material has been converted from aluminum to copper having lower electric resistance, and the interlayer dielectric film has been converted from a silicon oxide film to a low dielectric constant film (a film having a specific dielectric constant of less than 3). As a method of decreasing the dielectric constant of an interlayer dielectric film, there has been known a method of introducing a fluorine atom or a carbon atom having a small atomic radius into the interlayer dielectric film. In particular, as an interlayer dielectric film, the dielectric constant of which has been decreased by introducing a carbon atom into a silicon oxide film, carbon-incorporated silicon oxide (SiOC) has been widely used.

In a step of cleaning a semiconductor device, when the semiconductor device is washed by repeatedly using a cleaning solution according to single-wafer cleaning, there is a case where a silicon wafer serving as a dummy (hereinafter referred to as a "test wafer") is cleaned in the intervals of the cleaning of a semiconductor device of interest. This cleaning is carried out to examine whether or not an unacceptable change is generated in the properties of the cleaning solution due to the repeated use of the cleaning solution. When SiOC is used as a material for the semiconductor device as a cleaning target, there is a case where a test wafer prepared by forming a SiOC film particularly on a single crystal silicon wafer is used.

Such a test wafer prepared by forming a SiOC film on a silicon wafer is repeatedly used. However, the number of using the test wafer is limited due to corrosion caused by a cleaning solution. With regard to such a test wafer, which is hardly used due to repeated use, it is desired to recycle the test wafer by removing the SiOC film from it and then forming a SiOC film again on it. Herein, in the step of removing the SiOC film from the test water, it is necessary to promptly remove the SiOC film from the test wafer. Accordingly, it has been strongly desired to develop a cleaning solution, which removes the SiOC film from the wafer in a short time and does not corrode Si.

Patent Literature 1 (International Publication WO 2009/031270) describes that a recycled silicon wafer having a thickness of 600 μm or more can be used as a dummy wafer.

Patent Literature 2 (JP Patent Publication (Kokai) No. 10-177998 A (1998)) proposes a cleaning solution comprising hydrofluoric acid and ammonium fluoride, and having a pH value of 1.8 to 6. However, since this cleaning solution cannot remove SiOC from a wafer at a satisfactory level, it cannot be used in industrial production activities (see Comparative Examples 9 and 10).

Patent Literature 3 (International Publication WO 2004/019134) proposes a cleaning solution comprising at least one selected from the group consisting of organic acids and organic solvents, and hydrofluoric acid. However, since this cleaning solution cannot remove SiOC from a wafer, it cannot be used in industrial production activities (see Comparative Example 11).

Patent Literature 4 (JP Patent Publication (Kokai) No. 2006-203181 A) proposes a cleaning solution comprising hydrofluoric acid and nitric acid, and further comprising at least one of ammonium fluoride and ammonium chloride. However, since this cleaning solution cannot remove SiOC from a wafer, it cannot be used for the purpose of recycling a test wafer, in which a SiOC film has been formed on a silicon wafer (see Comparative Examples 12 and 13).

CITATION LIST

Patent Literature

Patent Literature 1: International Publication WO 2009/031270
Patent Literature 2: JP Patent Publication (Kokai) No. 10-177998 A (1998)
Patent Literature 3: International Publication WO 2004/019134
Patent Literature 4: JP Patent Publication (Kokai) No. 2006-203181 A

SUMMARY OF INVENTION

Technical Problem

It is an object of the present invention to provide a cleaning solution for removing SiOC from the surface of a wafer in a step of producing a wafer comprising a material containing the SiOC, and a cleaning method of using the same.

Solution to Problem

The present invention provides a method for achieving the aforementioned object. The present invention is as follows.
[1] A cleaning solution for removing carbon-incorporated silicon oxide from the surface of a wafer, wherein the cleaning solution comprises: 2% by mass to 30% by mass of a fluorine compound; 0.0001% by mass to 20% by mass of a cationic surfactant that is an ammonium salt or an amine having only one alkyl group containing 10 or more carbon atoms in the molecule thereof; and water, and the cleaning solution has a pH value of 0 to 4. In one embodiment of the present invention, the cationic surfactant that is an ammonium salt having only one alkyl group containing 10 or more carbon atoms in the molecule thereof is preferably one or more selected from the group consisting of alkylammonium chloride, alkylammonium bromide, alkylammonium alkylsulfate, alkylamino acetic acid betaine, and alkylamine acetate. In addition, in one embodiment of the present invention, the cationic surfactant that is an amine having only one alkyl group containing 10 or more carbon atoms in the molecule thereof is preferably one or more selected from the group consisting of polyoxyethylenealkylamine, polyoxyethylene polyoxypropylene alkylamine, and alkylamine oxide.
[2] The cleaning solution according to the above [1], wherein the fluorine compound is one or more selected from the group consisting of hydrofluoric acid, ammonium fluoride, and tetramethylammonium fluoride.

[3] The cleaning solution according to the above [1] or [2], wherein the cationic surfactant that is an ammonium salt or an amine having only one alkyl group containing 10 or more carbon atoms in the molecule thereof is one or more selected from the group consisting of decyltrimethylammonium chloride, dodecyltrimethylammonium chloride, undecyltrimethylammonium chloride, tridecyltrimethylammonium chloride, tetradecyltrimethylammonium chloride, pentadecyltrimethylammonium chloride, hexadecyltrimethylammonium chloride, heptadecyltrimethylammonium chloride, octadecyltrimethylammonium chloride, nonadecyltrimethylammonium chloride, decyltriethylammonium chloride, dodecyltriethylammonium chloride, undecyltriethylammonium chloride, tridecyltriethylammonium chloride, tetradecyltriethylammonium chloride, pentadecyltriethylammonium chloride, hexadecyltriethylammonium chloride, heptadecyltriethylammonium chloride, octadecyltriethylammonium chloride, nonadecyltriethylammonium chloride, decyltrimethylammonium bromide, dodecyltrimethylammonium bromide, undecyltrimethylammonium bromide, tridecyltrimethylammonium bromide, tetradecyltrimethylammonium bromide, pentadecyltrimethylammonium bromide, hexadecyltrimethylammonium bromide, heptadecyltrimethylammonium bromide, octadecyltrimethylammonium bromide, nonadecyltrimethylammonium bromide, decyltriethylammonium bromide, dodecyltriethylammonium bromide, undecyltriethylammonium bromide, tridecyltriethylammonium bromide, tetradecyltriethylammonium bromide, pentadecyltriethylammonium bromide, hexadecyltriethylammonium bromide, heptadecyltriethylammonium bromide, octadecyltriethylammonium bromide, nonadecyltriethylammonium bromide, lauryldimethylethylammonium ethyl sulfate, octadecyldimethylethylammonium ethyl sulfate, palmityldimethylethylammonium ethyl sulfate, lauryldimethylbenzylammonium chloride, stearyldimethylhydroxyethylammonium p-toluenesulfonate, lauryldimethylaminoacetic acid betaine, lauryldimethylamine oxide, tetradecylamine acetate, behenyltrimethylammonium chloride, decyldimethylbenzylammonium chloride, tetradecyldimethylbenzylammonium chloride, hexadecyldimethylbenzylammonium chloride, octadecyldimethylbenzylammonium chloride, behenyltrimethylammonium chloride, N-hydroxyethyllaurylamine, polyoxyethylenelaurylamine, polyoxyethylene polyoxypropylene laurylamine, polyoxyethylenedecylamine, polyoxyethylenestearylamine, polyoxyethyleneoleylamine, and polyoxyethylenetetradecylamine.

[4] The cleaning solution according to any one of the above [1] to [3], which further comprises an acid.

[5] The cleaning solution according to any one of the above [1] to [4], wherein the content of carbon atoms in the carbon-incorporated silicon oxide is 5% to 60% by atom.

[6] A cleaning method for removing carbon-incorporated silicon oxide from the surface of a wafer, which comprises using the cleaning solution according to any one of the above [1] to [5].

Advantageous Effects of Invention

By applying the cleaning solution of the present invention and a cleaning method of using the same, it becomes possible to remove SiOC from the surface of a treated product, and a high-precision and high-quality wafer can be produced with a high yield.

DESCRIPTION OF EMBODIMENTS

The cleaning solution of the present invention is preferably used in a step of recycling a wafer, and at that time, the present cleaning solution can remove SiOC at a sufficiently satisfactory speed.

The SiOC that can be used in the present invention is a material generally comprising 5% to 60% by atom of carbon atoms. The atomic composition percentage of the carbon atoms is preferably 5% by atom or more, more preferably 10% by atom or more, further preferably 15% by atom or more, and particularly preferably 20% by atom or more, and also, it is 55% by atom or less, more preferably 50% by atom or less, further preferably 45% by atom or less, and particularly preferably 40% by atom or less. In particular, the atomic composition percentage of the carbon atoms is preferably 5% to 55% by atom, more preferably 10% to 50% by atom, further preferably 15% to 45% by atom, and particularly preferably 20% to 40% by atom.

The concentration range of the fluorine compound used in the present invention is 2% by mass or more, preferably 2.5% by mass or more, more preferably 3% by mass or more, and particularly preferably 3.5% by mass or more, and also, it is 30% by mass or less, preferably 25% by mass or less, and more preferably 20% by mass or less. In particular, the concentration range of the fluorine compound used in the present invention is 2% to 30% by mass, preferably 2.5% to 25% by mass, more preferably 3% to 20% by mass, and particularly preferably 3.5% to 20% by mass. If the concentration range of the present fluorine compound is 2% by mass or less, there is a case where SiOC cannot be removed. Moreover, since the fluorine compound needs to be carefully handled, the concentration range thereof is preferably 30% by mass or less, and particularly preferably 20% by mass or less, from the viewpoint of safely handling the fluorine compound.

Specific examples of the fluorine compound used in the present invention include hydrofluoric acid, ammonium fluoride, and tetramethylammonium fluoride, but are not limited thereto. These fluorine compounds can be used alone, or can be formulated by combining two or more types.

The concentration range of the cationic surfactant used in the present invention is 0.0001% by mass or more, preferably 0.0005% by mass or more, more preferably 0.001% by mass or more, and particularly preferably 0.005% by mass or more, and also, it is 20% by mass or less, preferably 15% by mass or less, more preferably 10% by mass or less, and particularly preferably 5% by mass or less. In particular, the concentration range of the cationic surfactant used in the present invention is 0.0001% to 20% by mass, preferably 0.0005% to 15% by mass, more preferably 0.001% to 10% by mass, and particularly preferably 0.005% to 5% by mass. If the concentration range of the present cationic surfactant is 0.0001% by mass or less, there is a case where SiOC cannot be removed.

The cationic surfactant used in the present invention is an ammonium salt or an amine, which is characterized in that it has only one alkyl group containing 10 or more carbon atoms in the molecule thereof. The number of carbon atoms contained in the above-described alkyl group is preferably 11 or more, and more preferably 12 or more. On the other hand, the number of carbon atoms contained in the alkyl group is preferably 25 or less, more preferably 20 or less, and further preferably 18 or less.

In one embodiment of the present invention, the above-described cationic surfactant that is an ammonium salt, which is characterized in that it has only one alkyl group containing 10 or more carbon atoms in the molecule thereof, is preferably one or more selected from the group consisting of alkylammonium chloride, alkylammonium bromide, alkylammonium alkylsulfate, alkylaminoacetic acid betaine, and alkylamine acetate.

Moreover, in one embodiment of the present invention, the above-described cationic surfactant that is an amine, which is characterized in that it has only one alkyl group containing 10 or more carbon atoms in the molecule thereof, is preferably one or more selected from the group consisting of polyoxyethylenealkylamine, polyoxyethylene polyoxypropylene alkylamine, and alkylamine oxide.

Specific examples of the cationic surfactant used herein include, but are not limited to, decyltrimethylammonium chloride, dodecyltrimethylammonium chloride, undecyltrimethylammonium chloride, tridecyltrimethylammonium chloride, tetradecyltrimethylammonium chloride, pentadecyltrimethylammonium chloride, hexadecyltrimethylammonium chloride, heptadecyltrimethylammonium chloride, octadecyltrimethylammonium chloride, nonadecyltrimethylammonium chloride, decyltriethylammonium chloride, dodecyltriethylammonium chloride, undecyltriethylammonium chloride, tridecyltriethylammonium chloride, tetradecyltriethylammonium chloride, pentadecyltriethylammonium chloride, hexadecyltriethylammonium chloride, heptadecyltriethylammonium chloride, octadecyltriethylammonium chloride, nonadecyltriethylammonium chloride, decyltrimethylammonium bromide, dodecyltrimethylammonium bromide, undecyltrimethylammonium bromide, tridecyltrimethylammonium bromide, tetradecyltrimethylammonium bromide, pentadecyltrimethylammonium bromide, hexadecyltrimethylammonium bromide, heptadecyltrimethylammonium bromide, octadecyltrimethylammonium bromide, nonadecyltrimethylammonium bromide, decyltriethylammonium bromide, dodecyltriethylammonium bromide, undecyltriethylammonium bromide, tridecyltriethylammonium bromide, tetradecyltriethylammonium bromide, pentadecyltriethylammonium bromide, hexadecyltriethylammonium bromide, heptadecyltriethylammonium bromide, octadecyltriethylammonium bromide, nonadecyltriethylammonium bromide, lauryldimethylethylammonium ethyl sulfate, octadecyldimethylethylammonium ethyl sulfate, palmityldimethylethylammonium ethyl sulfate, lauryldimethylbenzylammonium chloride, stearyldimethylhydroxyethylammonium p-toluenesulfonate, lauryldimethylaminoacetic acid betaine, lauryldimethylamine oxide, tetradecylamine acetate, behenyltrimethylammonium chloride, decyldimethylbenzylammonium chloride, tetradecyldimethylbenzylammonium chloride, hexadecyldimethylbenzylammonium chloride, octadecyldimethylbenzylammonium chloride, behenyltrimethylammonium chloride, N-hydroxyethyllaurylamine, polyoxyethylenelaurylamine, polyoxyethylene polyoxypropylene laurylamine, polyoxyethylenedecylamine, polyoxyethylenestearylamine, polyoxyethyleneoleylamine, and polyoxyethylenetetradecylamine. These cationic surfactants, each of which is an ammonium salt or an amine characterized in that it has only one alkyl group containing 10 or more carbon atoms in the molecule thereof, can be used alone, or can be formulated by combining two or more types.

The water used in the present invention is preferably water, from which metal ions, organic impurities, particles and the like have been removed by distillation, an ion exchange treatment, a filter treatment, various types of adsorption treatments, etc. In particular, pure water or ultra-pure water is preferable. In addition, the concentration of water in the cleaning solution is preferably 50% by mass or more, more preferably 60% by mass or more, and further preferably 70% by mass or more. In such a case, the concentration of water means a balance from which various types of agents are removed.

The pH value of the cleaning solution of the present invention can be arbitrarily determined in the range of 0 to 4. The pH value of the cleaning solution of the present invention is preferably 0.1 or more, and more preferably 0.2 or more, and also, it is preferably 3.5 or less, more preferably 3.1 or less, and further preferably 2.5 or less. In particular, the pH value of the cleaning solution of the present invention is preferably 0 to 3.5, more preferably 0.1 to 3.1, and further preferably 0.2 to 2.5. When the pH value is in the aforementioned range, SiOC can be removed from the surface of a treated product.

As a pH adjuster, any given inorganic acid or organic acid can be used. Specific examples of such a pH adjuster that can be used herein include, but are not limited to, sulfuric acid, nitric acid, phosphoric acid, hydrochloric acid, acetic acid, citric acid, formic acid, malonic acid, lactic acid, and oxalic acid. These pH adjusters can be used alone, or can be formulated by combining two or more types.

The cleaning solution of the present invention may comprise additives that have conventionally been used in a cleaning solution for semiconductors, as desired, within a range that does not impair the purpose of the present invention. For example, any given alkali, oxidant, metal corrosion inhibitor, water-soluble organic solvent, reducing agent, chelating agent, anti-foaming agent, etc. can be added to the present cleaning solution.

The present invention also provides a cleaning method for etching or removing SiOC or a SiOC film from the surface of a wafer, using the cleaning solution of the present invention. In the cleaning method of the present invention, the cleaning solution of the present invention is allowed to come into contact with a wafer having a material comprising SiOC, so that SiOC or a SiOC film on the surface of the wafer can be etched or removed from the wafer surface. The method of allowing the cleaning solution of the present invention to come into contact with a wafer having a material comprising SiOC is not particularly limited. Examples of the contacting method that can be adopted herein include a method of immersing the wafer in the cleaning solution of the present invention and a method of allowing the wafer to come into contact with the present solution by instillation, spraying or the like.

The temperature, at which the cleaning solution of the present invention is used, is generally in the range of 20° C. to 85° C., and preferably in the range of 30° C. to 70° C., and the temperature may be selected, as appropriate, depending on etching conditions or the type of a wafer used. In addition, since a fluorine compound comprised in the cleaning solution of the present invention needs to be carefully handled, the present cleaning solution is preferably used at a temperature of 70° C. or lower, from the viewpoint of handling it safely.

The cleaning method of the present invention can be used in combination with ultrasonic wave, as necessary.

The time, at which the cleaning solution of the present invention is used, depends on the film thickness of SiOC, and the treating time can be arbitrarily changed unless there is a practical problem.

As a rinsing solution used after the use of the cleaning solution of the present invention, an organic solvent such as alcohol can be used. However, it is also sufficient to rinse the wafer with water.

EXAMPLES

Hereinafter, the present invention will be more specifically described in the following examples and comparative examples. However, these examples are not intended to limit the scope of the present invention.

Measurement of Thickness of SiOC Film;

As SiOC films, SiOC-A (comprising 50% by atom of carbon; film thickness: 6500 Å (0.65 µm)) and SiOC—B (comprising 10% by atom of carbon; film thickness: 10500 Å (1.05 µm)) were used. The film thickness of SiOC-A and SiOC—B was measured using an optical film thickness meter n & k 1280, manufactured by n & k Technology, Inc.

Measurement of Etching Rate of SiOC Film and Determination;

With regard to evaluation of the etching rate of SiOC-A and SiOC—B, a difference in the film thickness of SiOC-A or SiOC—B formed on a wafer, before and after a treatment with a cleaning solution, was divided by the treating time, and the thus calculated value was defined as an etching rate.

An etching rate of 250 Å/min (0.025 µm/min) or more was determined to be satisfactory.

Measurement of Etching Rate of Single Crystal Silicon and Determination;

As described above, single crystal silicon is preferably not etched by the treatment of a wafer. In order to evaluate the degree of single crystal silicon etched by the treatment of a wafer with the cleaning solution of the present invention, a single crystal silicon wafer was subjected to an immersion treatment using various types of cleaning solutions under predetermined conditions, and after completion of the treatment, the etching rate of the single crystal silicon was calculated based on the concentration of Si in the cleaning solution. The Si concentration was measured using ICP-AES (iCAP6300) manufactured by Thermo Scientific. The Si concentration in each cleaning solution was substituted into the following formula, so as to calculate the etching rate of the single crystal silicon.

Etching rate of single crystal silicon (ER)=Si concentration in cleaning solution (g/ml)×amount of treating agent liquid (g)/density of single crystal silicon (2.329 g/cm$^3$)/surface area of single crystal silicon wafer (cm$^2$)/treating time (40 min)×10$^8$ As described in the "Background Art" section, when the recycled silicon wafer has a thickness of 600 µm or more, it can be used as a dummy wafer. Since the thickness of the single crystal silicon wafer is 750 µm, a fluctuation in the thickness of the single crystal silicon wafer before and after the treatment is preferably within 150 µm. Since the time at which the cleaning solution of the present invention is used is recommended to be within 60 minutes, it can be said that the etching rate of the single crystal silicon by the cleaning solution is preferably 2.5 µm/min (25000 Å/min) or less.

Examples 1 to 10

Using both a wafer having a SiOC-A film and a wafer having a SiOC—B film, the cleaning effect of a cleaning solution to remove SiOC-A and SiOC—B from the two above wafers was examined. The cleaning solutions shown in Table 1 were each used. In each cleaning solution, SiOC-A was immersed for 25 minutes, SiOC—B was immersed for 40 minutes at each temperature shown in Table 2. Thereafter, each wafer was rinsed with ultrapure water, and was then dried by being sprayed with dry nitrogen gas. The etching rates of SiOC-A and SiOC—B were calculated by measuring the thicknesses of the SiOC-A and SiOC—B films on the washed wafers. Based on the obtained results, the performance of each cleaning solution to remove SiOC-A and SiOC—B from the waters was determined.

Using a single crystal silicon wafer (manufactured by KN Plats), damage to the single crystal silicon was examined. The single crystal silicon wafer was immersed in each cleaning solution shown in Table 1 at each temperature shown in Table 2 for 40 minutes, and thereafter, rinsing with ultrapure water and drying by dry nitrogen gas spraying were carried out on the resulting wafer. The Si concentration in the cleaning solution after completion of the immersion was measured, and the etching rate (ER) was then calculated.

In Examples 1 to 10, to which the cleaning solution of the present invention shown in Table 2 was applied, the etching rates of SiOC-A and SiOC—B were 250 Å/min (0.025 µm/min) or more. Thus, it was found that SiOC was etched. In addition, in Examples 1 to 10, the etching rates of single crystal silicons were all 25000 Å/min (2.5 µm/min) or less. Thus, the cleaning solution of the present invention preferably causes a small level of corrosion to single crystal silicon.

Comparative Examples 1 and 2

A wafer having a SiOC-A film and a wafer having a SiOC—B film were washed with cleaning solutions (Table 3, cleaning solutions 2A and 2B), in which hydrofluoric acid or Catiogen ES-L-9 [lauryldimethylethylammonium ethyl sulfate/isopropyl alcohol=90/10 (% by mass/% by mass)] (manufactured by Dai-ichi Kogyo Seiyaku Co., Ltd.), which was used as an ingredient of the cleaning solution used in Example 10 (Table 1, cleaning solution 1I), was replaced with water. The applied cleaning conditions and the cleaning results are shown in Table 4. When compared with the use of a cleaning solution (Table 1, cleaning solution1I) prepared by adding hydrofluoric acid to the cleaning solution 2A of Comparative Example 1 or adding Catiogen ES-L-9 to the cleaning solution 2B of Comparative Example 2, the etching rates of SiOC-A and SiOC—B using the cleaning solutions 2A and 2B were decreased. Accordingly, since the cleaning method of using the cleaning solution 2A or 2B cannot etch the SiOC film on the surface of a treated product in the step of producing a wafer as a target of the present invention, it cannot be used for the purpose of the present application (Table 4).

Comparative Example 3

A wafer having a SiOC-A film and a wafer having a SiOC—B film were washed with a cleaning solution (Table 3, cleaning solution 2C), in which Catiogen ES-L-9 as an ingredient of the cleaning solution (Table 1, cleaning solution1I) used in Example 10 was replaced with Catiogen ES-O [octyldimethylethylammonium ethyl sulfate/isopropyl alcohol=88/12 (% by mass/% by mass)] (manufactured by Dai-ichi Kogyo Seiyaku Co., Ltd.). The applied cleaning conditions and the cleaning results are shown in Table 4. When compared with the use of the cleaning solution of Example 10 (Table 1, cleaning solution1I), the etching rates of SiOC-A and SiOC—B using the cleaning solution 2C of Comparative Example 3 were decreased. Accordingly, since the cleaning method of using the cleaning solution 2C cannot etch the SiOC film on the surface of a treated product in the step of producing a wafer as a target of the present invention, it cannot be used for the purpose of the present application (Table 4).

Comparative Example 4

A wafer having a SiOC-A film and a wafer having a SiOC—B film were washed with a cleaning solution (Table 3, cleaning solution 2D), in which Catiogen ES-L-9 as an ingredient of the cleaning solution used in Example 10 (Table 1, cleaning solution1I) was replaced with Amogen LB-C [amidopropyl betaine laurate] (manufactured by Dai-ichi Kogyo Seiyaku Co., Ltd.). The applied cleaning conditions and the cleaning results are shown in Table 4. When compared with the use of the cleaning solution of Example 10 (Table 1, cleaning solution1I), the etching rates of SiOC-A and SiOC—B using the cleaning solution 2D of Comparative Example 4 were decreased. Accordingly, since the cleaning method of using the cleaning solution 2D cannot etch the SiOC film on the surface of a treated product in the step of producing a wafer as a target of the present invention, it cannot be used for the purpose of the present application (Table 4).

Comparative Example 5

A wafer having a SiOC-A film and a wafer having a SiOC—B film were washed with a cleaning solution (Table 3, cleaning solution 2E), in which Catiogen ES-L-9 as an ingredient of the cleaning solution used in Example 10 (Table 1, cleaning solution1I) was replaced with ARQUAD 2HT(F) [di(hydrogenated tallow alkyl)dimethylammonium chloride/isopropyl alcohol/water=95/3/2 (% by mass/% by mass/% by mass)] (manufactured by Lion Specialty Chemicals Co., Ltd.). The applied cleaning conditions and the cleaning results are shown in Table 4. When compared with the use of the cleaning solution of Example 10 (Table 1, cleaning solution1I), the etching rates of SiOC-A and SiOC—B using the cleaning solution 2E comprising ARQUAD 2HT(F) of Comparative Example 5 were decreased. Accordingly, since the cleaning method of using the cleaning solution 2E cannot etch the SiOC film on the surface of a treated product in the step of producing a wafer as a target of the present invention, it cannot be used for the purpose of the present application (Table 4).

Comparative Example 6

A wafer having a SiOC-A film and a wafer having a SiOC—B film were washed with a cleaning solution (Table 3, cleaning solution 2F), in which Catiogen ES-L-9 as an ingredient of the cleaning solution used in Example 10 (Table 1, cleaning solution1I) was replaced with Monogen Y-100 [sodium lauryl sulfate] (manufactured by Dai-ichi Kogyo Seiyaku Co., Ltd.). The applied cleaning conditions and the cleaning results are shown in Table 4. When compared with the use of the cleaning solution of Example 10 (Table 1, cleaning solution1I), the etching rates of SiOC-A and SiOC—B using the cleaning solution 2F comprising Monogen Y-100 of Comparative Example 6 were decreased. Accordingly, since the cleaning method of using the cleaning solution 2F cannot etch the SiOC film on the surface of a treated product in the step of producing a wafer as a target of the present invention, it cannot be used for the purpose of the present application (Table 4).

Comparative Example 7

A wafer having a SiOC-A film and a wafer having a SiOC—B film were washed with a cleaning solution (Table 3, cleaning solution 2G), in which Catiogen ES-L-9 as an ingredient of the cleaning solution used in Example 10 (Table 1, cleaning solution1I) was replaced with Epan 410 [structural formula: $H(OCH_2CH_2)_{1-2}$—$(OCH_2CH_2CH_2)_{21}$—$(OCH_2CH_2)_{1-2}H$] (manufactured by Dai-ichi Kogyo Seiyaku Co., Ltd.). The applied cleaning conditions and the cleaning results are shown in Table 4. When compared with the use of the cleaning solution of Example 10 (Table 1, cleaning solution1I), the etching rates of SiOC-A and SiOC—B using the cleaning solution 2G comprising Epan 410 of Comparative Example 7 were decreased. Accordingly, since the cleaning method of using the cleaning solution 2G cannot etch the SiOC film on the surface of a treated product in the step of producing a wafer as a target of the present invention, it cannot be used for the purpose of the present application (Table 4).

Comparative Example 8

An aqueous solution comprising 10% by mass of ammonium fluoride, 1% by mass of Catiogen ES-L-9 and 89% by mass of water (Table 3, cleaning solution 2H) has a pH value of 6.9. A wafer having a SiOC-A film and a wafer having a SiOC—B film were washed with this cleaning solution (2H). The applied cleaning conditions and the evaluation results are shown in Table 4. The etching rates of SiOC-A and SiOC—B using this cleaning solution were low. Accordingly, since the cleaning method of using the cleaning solution 2H cannot etch the SiOC film on the surface of a treated product in the step of producing a wafer as a target of the present invention, it cannot be used for the purpose of the present application (Table 4).

Comparative Example 9

A wafer having a SiOC-A film and a wafer having a SiOC—B film were washed with an aqueous solution comprising 8% by mass of hydrofluoric acid, 5% by mass of ammonium fluoride and 87% by mass of water (Table 3, cleaning solution 2I). The applied cleaning conditions and the evaluation results are shown in Table 4. The etching rates of SiOC-A and SiOC—B using this cleaning solution were low. Accordingly, since the cleaning method of using the cleaning solution 2I cannot etch the SiOC film on the surface of a treated product in the step of producing a wafer as a target of the present invention, it cannot be used for the purpose of the present application (Table 4).

Comparative Example 10

A wafer having a SiOC-A film and a wafer having a SiOC—B film were washed with an aqueous solution comprising 15% by mass of hydrofluoric acid, 5% by mass of ammonium fluoride and 80% by mass of water (Table 3, cleaning solution 2J). The applied cleaning conditions and the evaluation results are shown in Table 4. The etching rates of SiOC-A and SiOC—B using this cleaning solution were low. Accordingly, since the cleaning method of using the cleaning solution 2J cannot etch the SiOC film on the surface of a treated product in the step of producing a wafer as a target of the present invention, it cannot be used for the purpose of the present application (Table 4).

Comparative Example 11

A wafer having a SiOC-A film and a wafer having a SiOC—B film were washed with a solution comprising 0.05% by mass of hydrofluoric acid and 99.95% by mass of acetic acid (Table 3, cleaning solution 2K). The applied cleaning conditions and the evaluation results are shown in Table 4. The etching rates of SiOC-A and SiOC—B using this cleaning solution were low. Accordingly, since the cleaning method of using the cleaning solution 2K cannot etch the SiOC film on the surface of a treated product in the step of producing a wafer as a target of the present invention, it cannot be used for the purpose of the present application (Table 4).

Comparative Example 12

A wafer having a SiOC-A film and a wafer having a SiOC—B film were washed with an aqueous solution comprising 12% by mass of hydrofluoric acid, 12.6% by mass of nitric acid and 10.7% by mass of ammonium chloride (Table 3, cleaning solution 2L). The applied cleaning conditions and the evaluation results are shown in Table 4. The etching rates of SiOC-A and SiOC—B using this cleaning solution were low. Accordingly, since the cleaning method of using the cleaning solution 2L cannot etch the SiOC film on the surface of a treated product in the step of producing a wafer as a target of the present invention, it cannot be used for the purpose of the present application (Table 4).

Comparative Example 13

A wafer having a SiOC-A film and a wafer having a SiOC—B film were washed with an aqueous solution comprising 20% by mass of hydrofluoric acid, 12.6% by mass of nitric acid and 10.7% by mass of ammonium chloride (Table 3, cleaning solution 2M). The applied cleaning conditions and the evaluation results are shown in Table 4. The etching rates of SiOC-A and SiOC—B using this cleaning solution were low. Accordingly, since the cleaning method of using the cleaning solution 2M cannot etch the SiOC film on the surface of a treated product in the step of producing a wafer as a target of the present invention, it cannot be used for the purpose of the present application (Table 4).

Comparative Example 14

A wafer having a SiOC-A film and a wafer having a SiOC—B film were washed with an aqueous solution comprising 10% by mass of hydrofluoric acid and 10.7% by mass of ammonium chloride (Table 3, cleaning solution 2N). The applied cleaning conditions and the evaluation results are shown in Table 4. The etching rates of SiOC-A and SiOC—B using this cleaning solution were low. Accordingly, since the cleaning method of using the cleaning solution 2N cannot etch the SiOC film on the surface of a treated product in the step of producing a wafer as a target of the present invention, it cannot be used for the purpose of the present application (Table 4).

Comparative Example 15

A wafer having a SiOC-A film and a wafer having a SiOC—B film were washed with an aqueous solution comprising 12% by mass of hydrofluoric acid, 12.6% by mass of nitric acid and 7.4% by mass of ammonium chloride (Table 3, cleaning solution 2O). The applied cleaning conditions and the evaluation results are shown in Table 4. The etching rates of SiOC-A and SiOC—B using this cleaning solution were low. Accordingly, since the cleaning method of using the cleaning solution 2O cannot etch the SiOC film on the surface of a treated product in the step of producing a wafer as a target of the present invention, it cannot be used for the purpose of the present application (Table 4).

TABLE 1

| Cleaning solution | pH | Fluorine compound Type | Concentration (mass %) | Cationic surfactant Type | Concentration (mass %) | Acid Type | Concentration (mass %) | Water Concentration (mass %) |
|---|---|---|---|---|---|---|---|---|
| 1A | 0.1 | Hydrofluoric acid | 20 | ES-L-9 | 1 | — | — | 79 |
| 1B | 1.9 | Hydrofluoric acid | 3.5 | TDTAC | 10 | Nitric acid | 1 | 85.5 |
| 1C | 3.1 | NH$_4$F | 10 | ES-L-9 | 1 | Nitric acid | 12 | 77 |
| 1D | 1.0 | TMAF | 15 | ES-L-9 | 1 | Nitric acid | 12 | 72 |
| 1E | 1.9 | Hydrofluoric acid | 6.5 | AB-600 | 1 | Nitric acid | 0.25 | 92.25 |
| 1F | 0.6 | Hydrofluoric acid | 6.5 | F-215 | 1 | Nitric acid | 0.25 | 92.25 |
| 1G | 1.6 | Hydrofluoric acid | 6.5 | AOL | 1 | Nitric acid | 0.25 | 92.25 |
| 1H | 1.5 | Hydrofluoric acid | 5 | TDTAC | 0.001 | — | — | 95.999 |
| 1I | 1.0 | Hydrofluoric acid | 6.5 | ES-L-9 | 0.1 | — | — | 93.4 |

NH$_4$F: ammonium fluoride
TMAF: tetramethylammonium fluoride
ES-L-9: Catiogen ES-L-9 [lauryldimethylethylammonium ethyl sulfate/isopropyl alcohol = 90/10 (% by mass/% by mass)] (manufactured by Dai-ichi Kogyo Seiyaku Co., Ltd.)
TDTAC: tetradecyltrimethylammonium chloride
AB-600: Nissan Cation AB-600 [octadecyltrimethylammonium chloride/isopropyl alcohol = 65/35 (% by mass/% by mass)] (manufactured by NOF Corporation]
F-215: NYMEEN F-215 [polyoxyethylene alkyl (coconut) amine] (manufactured by NOF Corporation]
AOL: Amogen AOL [lauryldimethylamine oxide] (manufactured by Dai-ichi Kogyo Seiyaku Co., Ltd.)

TABLE 2

| Example | Cleaning solution | Temperature (° C.) | SiOC-A ER (Å/min) | SiOC-B ER (Å/min) | Single crystal Si ER (Å/min) |
|---|---|---|---|---|---|
| 1 | 1A | 30 | >250 | >250 | 110 |
| 2 | 1A | 60 | >250 | >250 | 173 |
| 3 | 1B | 70 | >250 | >250 | 52 |
| 4 | 1C | 70 | >250 | >250 | 117 |
| 5 | 1D | 70 | >250 | >250 | 138 |
| 6 | 1E | 60 | >250 | >250 | 76 |
| 7 | 1F | 60 | >250 | >250 | 59 |
| 8 | 1G | 60 | >250 | >250 | 67 |
| 9 | 1H | 40 | >250 | >250 | 41 |
| 10 | 1I | 40 | >250 | >250 | 55 |

The treating time for SiOC-A was set at 25 minutes, and the treating time for SiOC-B and single crystal silicon wafer was set at 40 minutes.
SiOC-A ER: etching rate of SiOC-A
SiOC-B ER: etching rate of SiOC-B
Single crystal Si ER: etching rate of single crystal Si

TABLE 3

| Cleaning solution | pH | Composition of cleaning solution (concentration: mass %) |
|---|---|---|
| 2A | 5.3 | ES-L-9: 0.1%, water: 99.9% |
| 2B | 1.5 | Hydrofluoric acid: 6.5%, water: 93.5% |
| 2C | 1.6 | Hydrofluoric acid: 6.5%, ES-O: 0.1%, water: 93.4% |
| 2D | 1.6 | Hydrofluoric acid: 6.5%, Amogen LB-C: 0.1%, water: 93.4% |
| 2E | 1.6 | Hydrofluoric acid: 6.5%, ARQUAD 2HT(F): 0.1%, water: 93.4% |
| 2F | 1.6 | Hydrofluoric acid: 6.5%, Monogen Y-100: 0.1%, water: 93.4% |
| 2G | 1.6 | Hydrofluoric acid: 6.5%, Epan 410: 0.1%, water: 93.4% |
| 2H | 6.9 | Ammonium fluoride: 10%, ES-L-9: 1%, water: 89% |
| 2I | 1.8 | Hydrofluoric acid: 8%, ammonium fluoride: 5%, water: 87% |
| 2J | 1.3 | Hydrofluoric acid: 15%, ammonium fluoride: 5%, water: 80% |
| 2K | 5.0 | Hydrofluoric acid: 0.05%, acetic acid: 99.95% |
| 2L | <1 | Hydrofluoric acid: 12%, nitric acid: 12.6%, ammonium fluoride: 10.7%, water: 64.7% |
| 2M | <1 | Hydrofluoric acid: 20%, nitric acid: 12.6%, ammonium fluoride: 10.7%, water: 56.7% |
| 2N | <1 | Hydrofluoric acid: 10%, ammonium fluoride: 15%, water: 75% |
| 2O | <1 | Hydrofluoric acid: 12%, nitric acid: 12.6%, ammonium fluoride: 7.4%, water: 68% |

ES-L-9: Catiogen ES-L-9 [lauryldimethylethylammonium ethyl sulfate/isopropyl alcohol = 90/10 (% by mass/% by mass)] (manufactured by Dai-ichi Kogyo Seiyaku Co., Ltd.)
ES-O: Catiogen ES-O [octyldimethylethylammonium ethyl sulfate/isopropyl alcohol = 88/12 (% by mass/% by mass)] (manufactured by Dai-ichi Kogyo Seiyaku Co., Ltd.)
Amogen LB-C: [amidopropyl betaine laurate] (manufactured by Dai-ichi Kogyo Seiyaku Co., Ltd.)
ARQUAD 2HT(F): [di(hydrogenated tallow alkyl)dimethylammonium chloride/isopropyl alcohol/water = 95/3/2 (% by mass/% by mass/% by mass)] (manufactured by Lion Specialty Chemicals Co., Ltd.)
Monogen Y-100: [sodium lauryl sulfate] (manufactured by Dai-ichi Kogyo Seiyaku Co., Ltd.)
Epan 410: [structural formula: $H(OCH_2CH_2)_{1-2}$—$(OCH_2CH_2CH_2)_{21}$—$(OCH_2CH_2)_{1-2}H$] (manufactured by Dai-ichi Kogyo Seiyaku Co., Ltd.)

TABLE 4

| Comparative Ex. | Cleaning solution | Temperature (° C.) | SiOC-A ER (Å/min) | SiOC-B ER (Å/min) |
|---|---|---|---|---|
| 1 | 2A | 40 | <1 | <1 |
| 2 | 2B | 40 | <1 | 100 |
| 3 | 2C | 40 | <1 | 13 |
| 4 | 2D | 40 | <1 | 13 |
| 5 | 2E | 40 | <1 | 38 |
| 6 | 2F | 40 | <1 | <1 |
| 7 | 2G | 40 | <1 | <1 |
| 8 | 2H | 40 | <1 | <1 |
| 9 | 2I | 45 | <1 | 145 |
| 10 | 2J | 70 | <1 | 138 |
| 11 | 2K | 25 | <1 | <1 |
| 12 | 2L | 25 | <1 | 100 |
| 13 | 2M | 70 | <1 | 75 |
| 14 | 2N | 45 | <1 | <1 |
| 15 | 2O | 70 | <1 | <1 |

The treating time for SiOC-A was set at 25 minutes, and the treating time for SiOC-B and single crystal silicon wafer was set at 40 minutes.
SiOC-A ER: etching rate of SiOC-A
SiOC-B ER: etching rate of SiOC-B

INDUSTRIAL APPLICABILITY

By applying the cleaning solution of the present invention and a cleaning method of using the same, it becomes possible to selectively remove SiOC from the surface of a treated product, and thus, the present invention is industrially useful.

The invention claimed is:

1. A cleaning solution consisting of:
   2% by mass to 30% by mass of a fluorine compound;
   0.0001% by mass to 20% by mass of a cationic surfactant that is an ammonium salt or an amine having only one alkyl group containing 10 or more carbon atoms;
   water;
   an acid which is at least one selected from the group consisting of sulfuric acid, nitric acid, phosphoric acid, hydrochloric acid, acetic acid, citric acid, formic acid, lactic acid, and oxalic acid; and
   optionally at least one selected from the group consisting of an alkali, an oxidant, a metal corrosion inhibitor, a water-soluble organic solvent, a reducing agent, a chelating agent, and an anti-foaming agent,
   wherein the cleaning solution has a pH value of 0 to 4.

2. The cleaning solution according to claim 1, wherein the cationic surfactant that is an amine having only one alkyl group containing 10 or more carbon atoms is one or more selected from the group consisting of polyoxyethylenealkylamine, polyoxyethylene polyoxypropylene alkylamine, alkylamine oxide, alkylaminoacetic acid betaine, and alkylamine acetate.

3. The cleaning solution according to claim 1, wherein the fluorine compound is one or more selected from the group consisting of hydrofluoric acid, ammonium fluoride, and tetramethylammonium fluoride.

4. The cleaning solution according to claim 1, wherein the cationic surfactant that is an ammonium salt or an amine having only one alkyl group containing 10 or more carbon atoms is one or more selected from the group consisting of decyltrimethylammonium chloride, dodecyltrimethylammonium chloride, undecyltrimethylammonium chloride, tridecyltrimethylammonium chloride, tetradecyltrimethylammonium chloride, pentadecyltrimethylammonium chloride, hexadecyltrimethylammonium chloride, heptadecyltrimethylammonium chloride, octadecyltrimethyl ammonium chloride, nonadecyltrimethylammonium chloride, decyltriethylammonium chloride, dodecyltriethylammonium chloride, undecyltriethyl ammonium chloride, tri decyltriethylammonium chloride, tetradecyltriethylammonium chloride, pentadecyltriethylammonium chloride, hexadecyltriethylammonium chloride, heptadecyltriethylammonium chloride, octadecyltriethylammonium chloride, nonadecyltriethylammonium chloride, decyltrimethylammonium bromide, dodecyltrimethylammonium bromide, undecyltrimethylammonium bromide, tridecyltrimethylammonium bromide, tetradecyltrimethylammonium bromide, pentadecyltrimethyl ammonium bromide, hexadecyltrimethylammonium bromide, heptadecyltrimethylammonium bromide, octadecyltrimethyl ammonium bromide, nonadecyltrimethylammonium bromide, decyltriethylammonium bromide, dodecyltriethylammonium bromide, undecyltriethyl ammonium bromide, tridecyltriethyl ammonium bromide, tetradecyltriethylammonium bromide, pentadecyltriethylammonium bromide, hexadecyltriethylammonium bromide, heptadecyltriethylammonium bromide, octadecyltriethylammonium bromide, nonadecyltriethylammonium bromide, lauryldimethylethylammonium ethyl sulfate, octadecyldimethylethylammonium ethyl sulfate, palmityldimethylethylammonium ethyl sulfate, lauryldimethylbenzylammonium chloride, stearyldimethylhydroxyethylammonium p-toluenesulfonate, lauryldimethylaminoacetic acid betaine, lauryldimethylamine oxide, tetradecylamine acetate, behenyltrimethylammonium chloride, decyldimethylbenzylammonium chloride, tetradecyldimethylbenzyl ammonium chloride, hexadecyldimethylbenzyl ammonium chloride, octadecyl dimethylbenzylammonium chloride, behenyltrimethylammonium chloride, N-hydroxyethyllauryl amine, polyoxyethylenelauryl amine, polyoxyethylene polyoxypropylene laurylamine, polyoxyethylenedecylamine, polyoxyethylenestearylamine, polyoxyethyleneoleylamine, and polyoxyethylenetetradecylamine.

5. A cleaning method, comprising:
removing carbon-incorporated silicon oxide from a surface of a wafer, with the cleaning solution according to claim 1.

6. The cleaning method according to claim 5, wherein a content of carbon atoms in the carbon-incorporated silicon oxide is 5% to 60% by atom.

* * * * *